United States Patent [19]
Clerc et al.

[11] Patent Number: 5,923,581
[45] Date of Patent: Jul. 13, 1999

[54] INFORMATION RECORDING MEDIUM, READING APPARATUS FOR SAID MEDIUM AND PROCESSES FOR IMPLEMENTING SAID APPARATUS

[75] Inventors: Jean-Frédéric Clerc, Le Fontanil; Bernard Bechevet, Claix, both of France

[73] Assignee: Commissariat A L'Energie Atomique, Paris, France

[21] Appl. No.: 08/991,001

[22] Filed: Dec. 15, 1997

[30]  Foreign Application Priority Data

Dec. 26, 1996 [FR] France .................................. 96 16036

[51] Int. Cl.$^6$ ..................................................... G11C 11/42
[52] U.S. Cl. ............................................ 365/112; 365/106
[58] Field of Search ..................................... 365/100, 106, 365/112

[56]  References Cited

U.S. PATENT DOCUMENTS

| | | |
|---|---|---|
| 3,119,099 | 1/1964 | Burnat ..................................... 365/112 |
| 3,801,966 | 4/1974 | Terao . |
| 3,833,894 | 9/1974 | Aviram et al. . |
| 4,139,980 | 2/1979 | Larson et al. . |

FOREIGN PATENT DOCUMENTS

| | | |
|---|---|---|
| 0 184 189 | 6/1986 | European Pat. Off. . |
| 0 363 147 | 4/1990 | European Pat. Off. . |
| 0 378 443 | 7/1990 | European Pat. Off. . |
| 0 665 541 | 8/1995 | European Pat. Off. . |
| 1391259 | 3/1964 | France . |
| WO 89/12302 | 12/1989 | WIPO . |
| WO 94/05011 | 3/1994 | WIPO . |

OTHER PUBLICATIONS

H. Fleisher, et al., IBM Technical Disclosure Bulletin, vol. 14, No. 12, pp. 3581 and 3582, May 1972, "Storage Element for Machine Use".

*Primary Examiner*—Terrell W. Fears
*Attorney, Agent, or Firm*—Oblon, Spivak, McClelland, Maier & Neustadt, P.C.

[57]  ABSTRACT

Information recording medium, reading apparatus for said medium and processes for implementing the apparatus. According to the invention, the material constituting the recording layer (15) is photoconducting. The apparatus comprises in particular a microprobe (20) and a light source (26) capable of subjecting the recording layer to a lit or unlit state. The resulting variations in resistivity are used to determine whether the read zone is amorphous or crystalline.

15 Claims, 4 Drawing Sheets

INFORMATION RECORDING MEDIUM, READING APPARATUS FOR SAID MEDIUM AND PROCESSES FOR IMPLEMENTING SAID APPARATUS

BACKGROUND OF THE INVENTION

1. Field of the Invention

The present invention relates to an information recording medium, a reading apparatus for said medium and processes for implementing said apparatus. It can be applied to recording information which may consist of images, sounds, data etc.

The invention may be applied particularly to television and the construction of computer memories.

2. Discussion of the Background

The recording of information by means of a microprobe that acts on a suitable medium is already known in the art. A microprobe is understood to mean a mechanical probe of an approximate size of less than one micron. Such probes usually conduct electricity. A current flowing between such a probe and a medium causes localized heating of the medium, which may cause modifications in the structure of the medium and, for example, cause it to pass from a crystalline to an amorphous state. This is the write operation. Subsequent measurement of the characteristics of the crystalline or amorphous material, for example its conductivity, constitutes the read operation.

This technique is sometimes referred to as phase-change recording and provides a high density of information. The probe used is of the same type as those found in Atomic Force Microscopes (AFM).

FIG. 1 attached illustrates this technique. It shows a substrate 10 covered with a conducting layer 12 that acts as an electrode and a recording layer 14. This layer contains zones where the material is either in the amorphous (Za) or the crystalline (Zc) state. A microprobe 20 is placed in contact with these zones. A power source V is connected to microprobe 20 and covered electrode 12. The power source causes a current I to flow through the assembly. The current is then measured by means 24.

Current I may have two intensities, Ia and Ic respectively, depending on whether the zone tested is amorphous (Za) or crystalline (Zc). The resistance of recording layer 14 may have two values, Ra and Rc respectively, depending on whether the material is in the crystalline or the amorphous state. In practice resistance Ra is weaker that resistance Rc. Thus:

Ia=V/Ra when the recording layer is in the amorphous state,

Ic=V/Rc when the recording layer is in the crystalline state.

The higher the ratio between Ra/Rc, the more obvious the difference between the two states.

FIGS. 2 and 3 show another method of reading this type of medium in which the tunnel effect is used. The medium again consists of a substrate 10, a covered electrode 12 and a recording layer 14. The reading apparatus again comprises a microprobe 20, a power source 22 and measuring means 24, but microprobe 20 is now remote from layer 14 by a distance d. The tunnel effect means that a current is still able to penetrate the recording layer despite this gap.

In order to establish the value of the current intensity a current-voltage diagram, such as that shown in FIG. 3, is required. In this diagram the voltage is plotted on the abscissa and the current on the ordinate. The current-voltage characteristic is an elbow-shaped curve similar to that of tunnel diodes. Three characteristics, C1, C2 and C3 are plotted in FIG. 3, corresponding to three different distances d1, d2 and d3 between the probe and the recording layer. At a given voltage, the lower the distance, the greater the current. Therefore in the case shown in FIG. 3 d1<d2<d3.

The load line relates the current to the voltage taking the resisting aspect of the circuit into consideration. When the tested zone is amorphous, resistance Ra is great and the drop in voltage significant. For a crystalline zone, however, both resistance Rc and drop in voltage are weak. The load lines take the form shown in FIG. 3 (references DCa and DCc) for an amorphous zone Za and a crystalline zone Zc respectively.

If characteristic C2 relative to a distance d2 is considered, the working point is situated either at Ma if the zone is amorphous or at Mc if it is crystalline. The current-voltage couple is either Ia-Va for an amorphous zone or Ic-Vc for a crystalline zone. By measuring the current it is therefore possible to distinguish the state of the tested zone and thus the information recorded thereon.

Although such apparatuses are satisfactory in some respects, they nevertheless have certain drawbacks. The first, as can be seen from FIG. 1, is the need for contact between the probe and the recording layer which, with time, causes wearing of the probe leading to read errors. The second, as can be seen from FIGS. 2 and 3, overcomes these difficulties but encounters others due to the fact that the measuring operation performed by the system is very sensitive to variations in the height of the probe relative to the recording layer. As can be seen in FIG. 3, for a given voltage V the current flowing in a zone, whether amorphous or crystalline, is greatly dependent on distance d. A crystalline zone may well be considered amorphous if the height of the probe is reduced.

The object of the present invention is to overcome precisely these drawbacks.

SUMMARY OF THE INVENTION

To this end the invention provides a recording medium based upon a new physical principal, i.e. photoconduction. In addition to being capable of assuming amorphous or crystalline state, the recording layer is also photoconducting, i.e. its resistance (or, which amounts to the same thing, the resistance of a zone of given dimensions) varies depending on the lighting of the layer. The resistivity should preferably vary considerably between the amorphous and crystalline states.

The invention makes it possible to discriminate an amorphous zone from a crystalline zone without physical contact. It performs this discrimination for layers with variations in surface evenness of the order of several nanometers for an area of 100 $\mu m^2$, i.e. too great to allow reading using the tunnel effect.

According to the invention the distinction between an amorphous zone and a crystalline zone no longer depends on variations in resistance between the amorphous and crystalline states but on variations in resistance between the lit and unlit states, this variation depending on the state of the material, according to whether it is amorphous or crystalline. In other words the ratios Ra/Ra* and Rc/Rc*, where the asterisk signifies the lit state, should be as different as possible. Reading can then be performed easily without physical contact since sensitivity to the position of the probe is less than in the prior art. Clearly, reading may also take place with physical contact.

Strictly speaking, the present invention therefore relates to an information recording medium comprising a substrate, a conducting layer and a recording layer made of a material capable of including a variety of zones that are either in the amorphous or the crystalline state, each of said zones constituting an information recording zone, said medium characterized by the fact that the material of the recording layer is photoconducting and has a resistivity that depends on lighting, said material having a first resistance Ra in the absence of light and a second resistance Ra* in the presence of light for a zone in which the material is amorphous, a third resistance Rc in the absence of light and a fourth resistance Rc* in the presence of light for a zone in which the material is crystalline, the ratio Ra/Ra* being different from ratio Rc/Rc*.

The photoconducting material used to constitute the recording layer is preferably a semiconductor of the type composed of silicon and II-IV and III-V composites.

It is also preferable for the photoconducting material of the recording layer to be a silver-based alloy and/or indium and/or antimony and/or tellurium and/or chrome.

It is a further object of the present invention to provide a reading apparatus for a medium such as that described above. Said apparatus comprises at least one microprobe, means for displacing said microprobe to position it above any of the recording zones of the medium, means for passing a current through the microprobe and said zone and means for measuring the intensity of said current, the apparatus being characterized by the fact that it also comprises a light source capable of illuminating at least one zone of the medium above which the probe is disposed, means of controlling said light source to cause a lit or unlit state of the said zone.

Said displacement means should be capable of displacing the microprobe above the recording layer without coming into physical contact with said layer.

It is a further object of the present invention to provide processes for implementing said apparatus. In a first implementation, a measurement is taken of the variation in intensity of the current when a given zone of the recording layer passes from a first lighting state to a second lighting state and the value of the information recorded in said zone is deduced from said variation in intensity.

In a second implementation, a measurement is taken of the variation in distance between the microprobe and the recording layer that ensures the current a constant intensity when a given zone of the recording layer passes from a first lighting state to a second lighting state and the value of the information recorded in said zone is deduced from said variation in distance.

In each of these procedures each zone may be read one after the other by passing said zone alternately through a first lighting state and then a second lighting state; alternatively the entire medium may be passed from one lighting state to the other and the characteristics, whether of intensity or distance, read off for all the zones in each lighting state.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In the following description:

Ra signifies the resistance of an unlit amorphous zone,

Ra* signifies the resistance of a lit amorphous zone,

Rc signifies the resistance of an unlit crystalline zone,

Rc* signifies the resistance of a lit crystalline zone.

In order for the invention to be implemented Ra/Ra* must be different from Rc/Rc*. This is generally the case in photoconducting materials without any special provisions being made, and is true, for example, of silicon semiconductor composites, II-IV and III-V composites and certain alloys.

Figure 1:
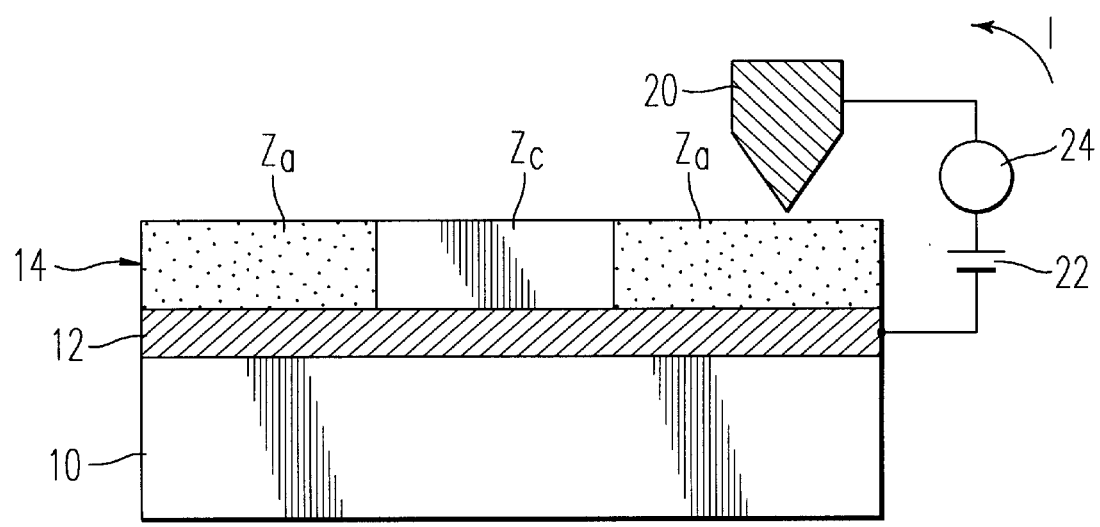
FIG. 1 (already described) shows a known recording medium and a known apparatus for contact reading, FIG. 2 (already described) shows a known apparatus for reading without contact, FIG. 3 (already described) shows a current-voltage diagram illustrating the operation of the apparatus of FIG. 2.
Figure 2:
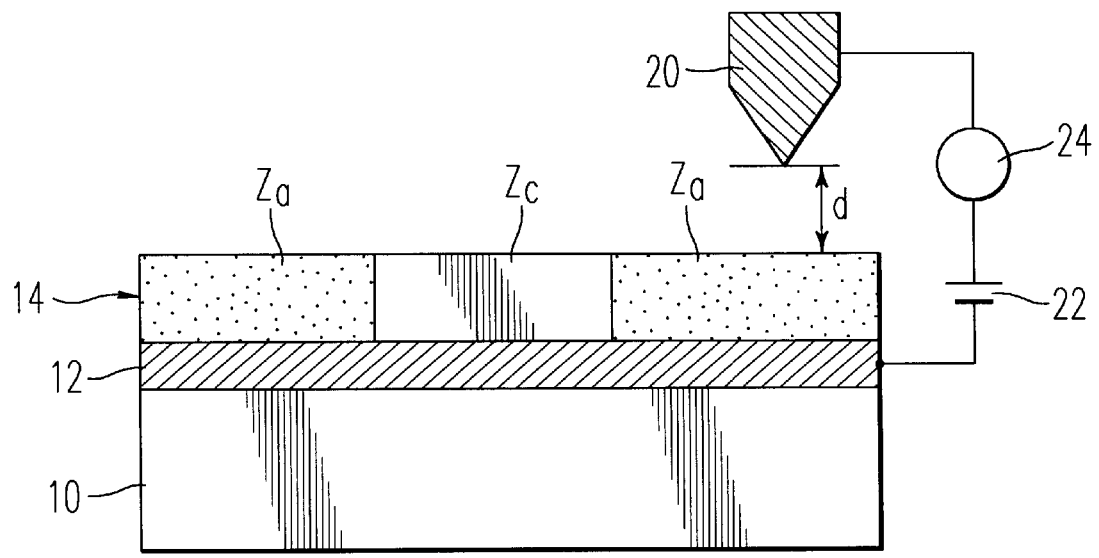
Figure 3:
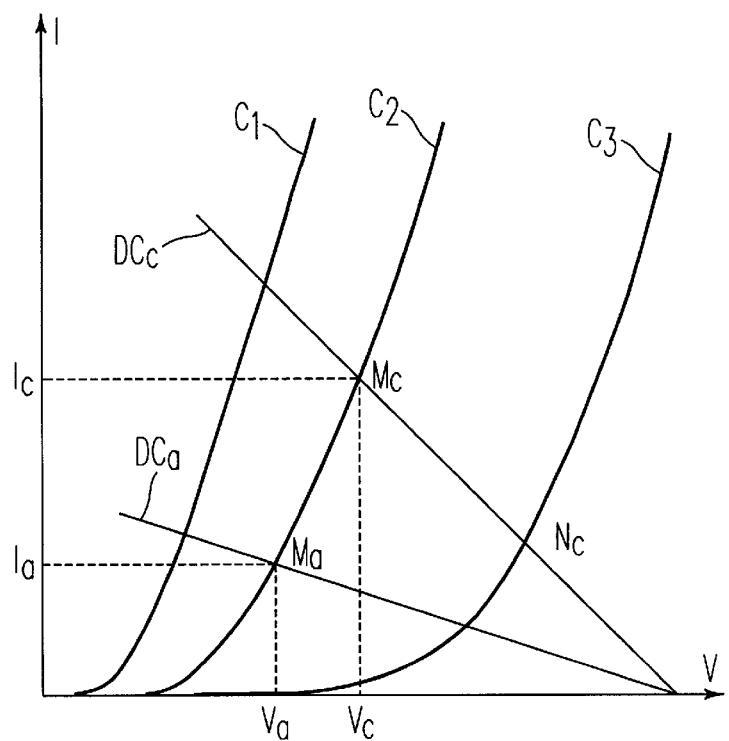
Figure 4:
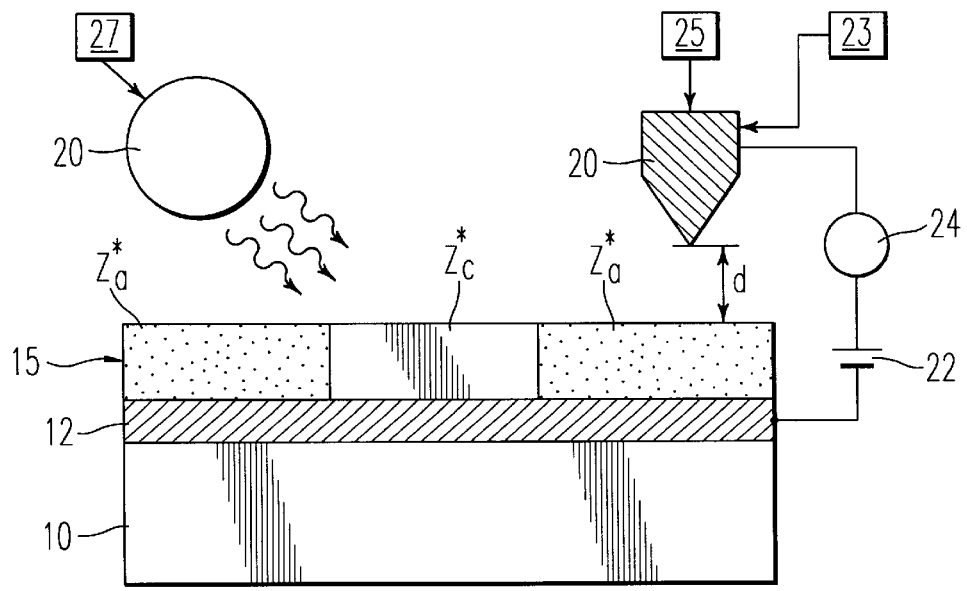
FIG. 4 shows a recording medium according to the invention together with a reading apparatus according to the invention.

FIG. 4 shows a recording medium and a reading apparatus according to the invention. This Figure reproduces the means already illustrated in FIG. 2 with the same numberings. In accordance with the invention, the recording medium (numbered 15) is made of a photoconducting material. The reading apparatus also comprises a light source 26 capable of illuminating at least the tested zone, said source being controlled by means 27. The apparatus comprises means 23 capable of displacing microprobe 20 in two orthogonal directions to position probe 20 above any zone, and means 25 capable of adjusting the distance d separating microprobe 20 and recording layer 15.

The radiation emitted by source 26 is in the inhibited band of the photoconducting material, which lowers resistance. Recording layer 15 therefore comprises amorphous and crystalline zones, each of which is either lit or unlit. These zones are referred to below as Za and Zc for unlit amorphous or crystalline zones or Za* and Zc* for lit amorphous or crystalline zones respectively.

Figure 5:
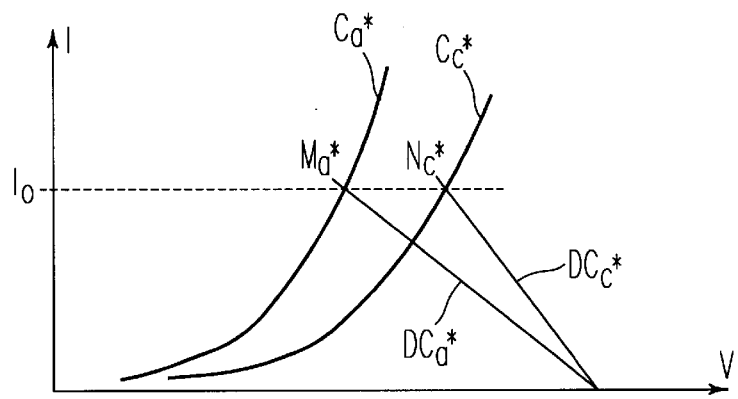
FIG. 5 shows a current-voltage diagram illustrating the adjustment in intensity at a given value.
Figure 6:
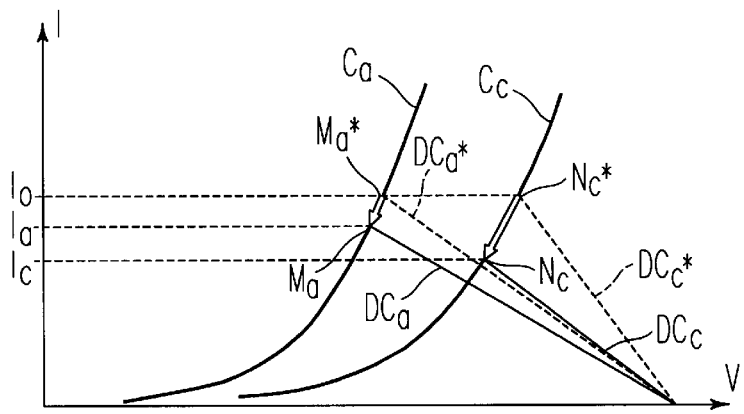
FIG. 6 shows a current-voltage diagram illustrating the variation in intensity for an amorphous zone and a crystalline zone.

In the implementation illustrated in FIGS. 4 to 7, reading is performed in two phases:

in the first phase, which may be a lit phase, the apparatus behaves as shown in FIG. 5; this Figure is a current-voltage diagram and shows two characteristics, Ca* and Cc*, that are dependent on whether the zone is amorphous or crystalline; two load lines are also shown, DCa* and DCc* respectively. In this first phase the distance (d) between the microprobe 20 and the recording layer 15 is set to obtain a current intensity equivalent to a given value Io; the working point is therefore Ma* or Nc* depending on whether the zone read is amorphous or crystalline.

in a second phase the zone read is subjected to a second lighting state, for example unlit as in the case illustrated, and the resulting drop in current is measured; the diagram in FIG. 6 illustrates this phenomenon. If the probe is located above an amorphous zone the load line changes from position DCa* to position DCa because the resistance changes from Ra* to Ra; the working point moves from Ma* to Ma and the intensity drops from Io to Ia. If the probe is located above a crystalline zone the load line changes from position DCc* to position DCc because the resistance changes from Rc* to Rc; the working point changes from Nc* to Nc and the intensity drops from Ia to Ic.

As soon as Ra/Ra* is different from Rc/Rc* the intensities Ia and Ic are different and discrimination between amorphous and crystalline states is possible.

Obviously the invention can be operated using the lighting states in reverse, i.e. beginning with a first, unlit phase and continuing with a second, lit phase. This will cause an increase rather than a decrease in current, but this variation will still be sufficient to discriminate an amorphous zone from a crystalline zone.

In another variation the apparatus operates at constant current intensity (Io) and measurements are taken under lit and unlit conditions of the distances between microprobe 20 and recording later 15 needed to ensure this constant intensity. Discrimination in this configuration is between the differences in distance observed.

As in the first implementation two phases can be employed:

in the first phase the zone to be read is subjected to a first lighting state (lit or unlit) and the distance separating microprobe 20 from recording layer 15 is adjusted to a first value dl to obtain an intensity equivalent to a given value Io, in a second phase the zone read is subjected to a second lighting state (unlit or lit) and the distance separating microprobe 20 from recording layer 15 is readjusted to a second value d2 needed to ensure the same intensity Io; the information recorded is deduced from the difference between the first value dl and the second, d2.

In both of these procedures the system can operate by either passing each zone individually from one lighting state to the other, or alternatively all the zones may be passed from one lighting state to the other.

Figure 7:
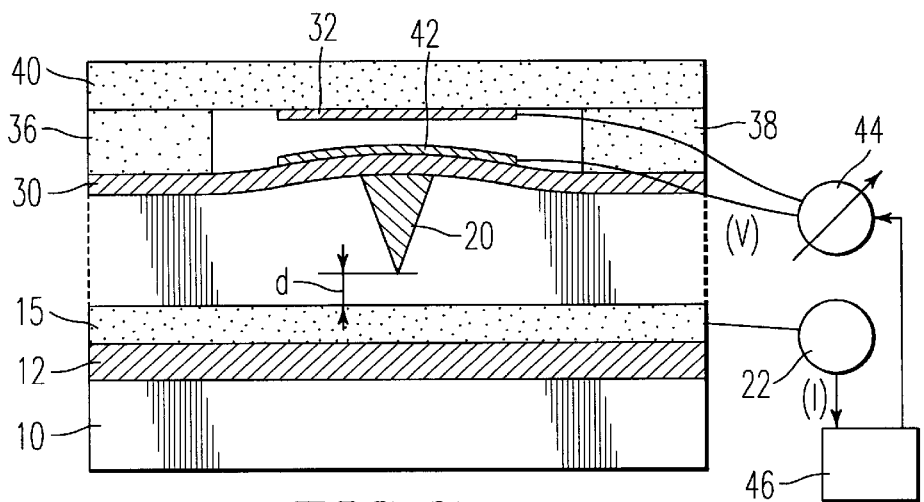
FIG. 7 shows an embodiment of an apparatus in which the distance between the microprobe and the medium is adjustable.

FIG. 7 shows an embodiment of the means for adjusting the distance d between microprobe 20 and recording layer 15. These means comprise a flexible membrane 30 underneath which microprobe 20 is fastened together with an electrode 32 fastened to the upper surface of the membrane, another electrode 34, two spacers 36, 38, a rigid plate 40 and a second electrode 42 fastened underneath plate 40. The two electrodes 32 and 42 are connected to two poles of a power source 44. By adjusting voltage V produced by power source 44 the electrostatic force operating between the two electrodes 32 and 42 can be set, thereby controlling the deflection of membrane 30. The voltage is set by a central processing unit 46 that also receives the value of the current intensity passing through the microprobe. This central processing unit 46 adjusts the voltage so that the intensity of the current has the required value (Io). This height adjustment is performed for a first lighting state and may be maintained for the second lighting state, in which case central processing unit 46 reads the variation in intensity obtained when the zone passes into the second lighting phase. In a variant, central processing unit 46 maintains the intensity of the current at the same value in both lighting states and determines the two values to be applied to obtain the two distances that will ensure the same current intensity.

Figure 8:
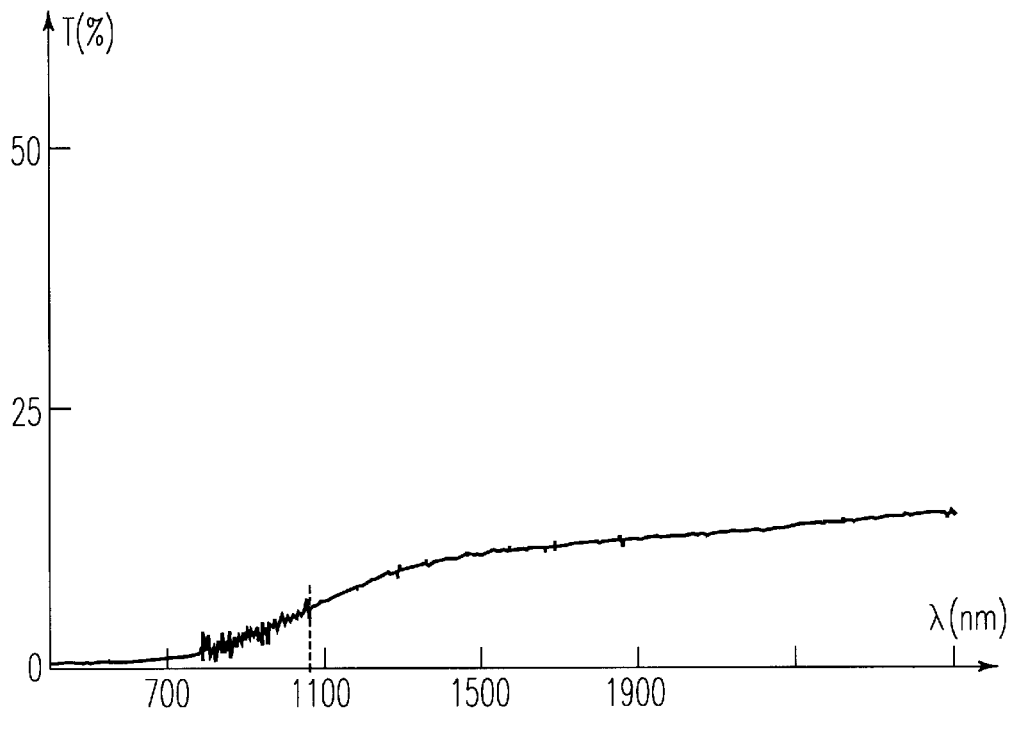
FIG. 8 is a diagram illustrating the transmission coefficient of a photoconducting material in the crystalline state as a function of wavelength.

FIG. 8 shows the variations in the transmission coefficient as a function of the wavelength (in nm) for photoconducting material AgIn(Cr) in the crystalline state. The reversal point of the layer lies at approximately 1080 nm. In this case the light source that needs to be used to cause photoconduction may be a solid-state laser doped with neodymium, for example a neodymium-doped YAG laser operating at 1060 nm.

Figure 9:
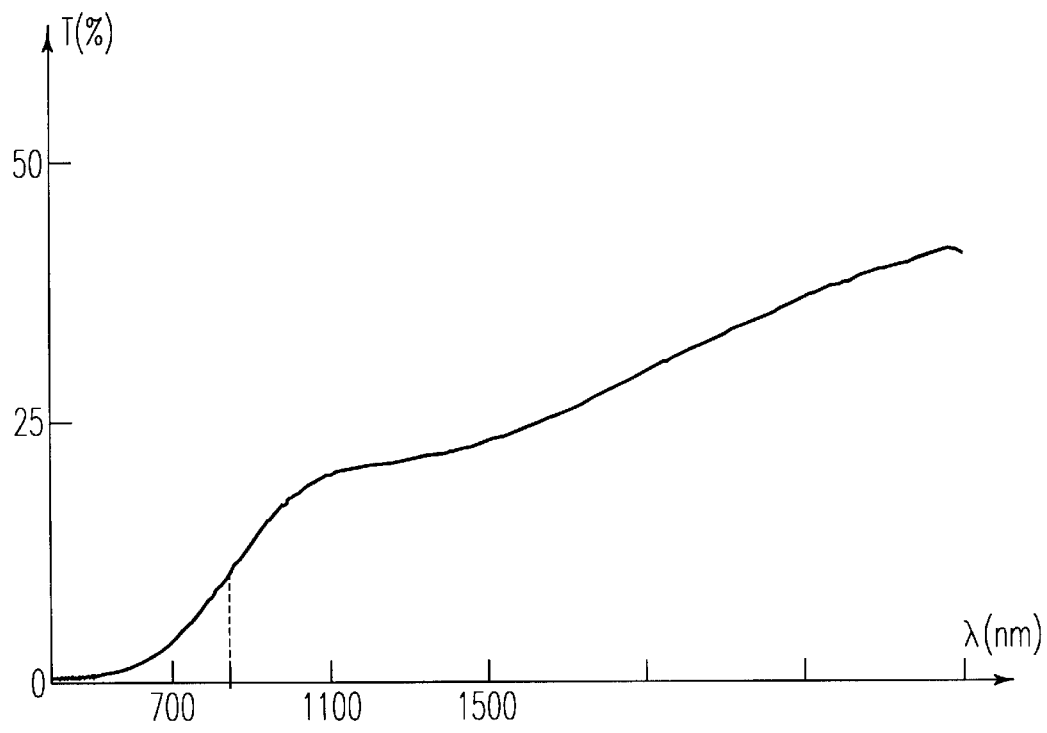
FIG. 9 is a diagram illustrating the transmission coefficient of a photoconducting material in the amorphous state as a function of wavelength.

FIG. 9 shows the same variations for the material AgIn (Am) in the amorphous state. The reversal point lies at approximately 850 nm. A laser diode operating at 0.8 $\mu$m may be used in this case.

We claim:

1. Information recording medium comprising a substrate, a conducting layer, a recording layer and a material capable of existing in either an amorphous or crystalline state in different zones, each of said zones constituting an information recording zone, wherein material of the recording layer is made of a photoconducting material that has a resistivity dependent on lighting, said material having a first resistance Ra in the absence of lighting and a second resistance Ra* in the presence of lighting for a zone where the material is in the amorphous state, a third resistance Rc in the absence of lighting and a fourth resistance Rc* in the presence of lighting for a zone where the material is in the crystalline state, the ratio Ra/Ra* being different from the ratio Rc/Rc*.

2. Medium of claim 1 wherein the photoconducting material of recording layer is a semiconductor.

3. Medium of claim 2 wherein the photoconducting material of recording layer is a semiconductor selected from the group made up of silicon and II-IV and III-V composites.

4. Medium of claim 1 wherein the photoconducting material of recording layer is a silver-based alloy and/or indium and/or antimony and/or tellurium and/or chrome.

5. Reading apparatus for medium of claim 1, said apparatus comprising at least one microprobe, means for displacing said microprobe so that it is positioned above any of the recording zones of the medium (Za, Zc), means for passing a current through microprobe and said zone (Za, Zc) and means for measuring the intensity of the current, said apparatus being characterized by the fact that it also comprises a light source capable of illuminating at least the zone of the medium above which the probe is disposed, means of controlling said light source to produce a lit or unlit state of the said zone (Za*, Zc*), (Za, Zc).

6. Apparatus of claim 5 wherein displacement means of microprobe are capable of displacing the microprobe above the recording layer without touching said layer.

7. Apparatus of claim 6 wherein means for displacing the microprobe comprise means for adjusting the distance (d) between microprobe and recording layer.

8. A process for reading information from an information recording medium wherein the medium includes a substrate a conducting layer, a recording layer and a material capable of existing in either an amorphous or crystalline state in different zones, each of said zones constituting an information recording zone wherein material of the recording layer is made of a photoconductive material that has a resistivity dependent on lighting, said material having a first resistance Ra in the absence of lighting and a second resistance Ra* in the presence of lighting for a zone where the material is in the amorphous state, a third resistance Rc in the absence of lighting and a fourth resistance Rc* in the presence of lighting for a zone where the material is in the crystalline state, the ratio Ra/Ra* being different from the ratio Rc/Rc* and wherein said information recording medium is read by a reading apparatus including at least one microprobe, means for displacing said microprobe so that it is positioned above any of the recording zones of the medium, means for passing a current through said microbe and said zone and means for measuring the intensity of the current, said apparatus further comprising a light source capable of illuminating at least the zone of the medium above which the probe is disposed and means for controlling said light source to produce a lit or unlit state of said zone, said process comprising the steps of:

taking a measurement for a given zone of the recording layer of the variation in intensity of the current when said zone is passed from a first lighting state to a second lighting state; and deducing the value of the information recorded in said zone from said variation in intensity.

9. Process of claim 8, wherein said steps of measuring and deducing are divided into two phases:

in the first phase the zone to be read is subjected to a first lighting state and the distance (d) separating microphone from the recording layer is set to obtain an intensity equivalent to a given value "(Io)", in a second phase the zone read is subjected to a second lighting state; a measurement is taken of the new value for the intensity (Ia or Ic) and the information recorded is deduced from the variation in intensity.

10. Process of claim 8 or 9 in which all the information recorded on the medium can be read by measuring said variations in intensity in each zone, one by one.

11. Process of claim 8 or 9 in which all the information recorded on the medium can be read by measuring variations in intensity in each zone of the medium by first placing all the zones in a first lighting state, then measuring the intensity of each individual zone by placing all the zones in a second lighting state; the variation in intensity for each zone is deduced from the differences between the first and second states.

12. A process for reading information from an information recording medium wherein the medium includes a substrate, a conducting layer, a recording layer and a material capable of existing in either an amorphous or crystalline state in different zones, each of said zones constituting an information recording zone wherein material of the recording layer is made of a photoconductive material that has a resistivity dependent on lighting, said material having a first resistance Ra in the absence of lighting and a second resistance Ra* in the presence of lighting for a zone where the material is in the amorphous state, a third resistance Rc in the absence of lighting and a fourth resistance Rc* in the presence of lighting for a zone where the material is in the crystalline state, the ratio Ra/Ra* being different from the ratio Rc/Rc* and wherein said information recording medium is read by a reading apparatus including at least one microprobe, means for displacing said microprobe so that it is positioned above any of the recording zones of the medium, means for passing a current through said microbe and said zone and means for measuring the intensity of the current, said apparatus further comprising a light source capable of illuminating at least the zone of the medium above which the probe is disposed and means for controlling said light source to produce a lit or unlit state of said zone, said process comprising steps of:

for a given zone of recording layer, providing a variation in distance (d1, d2) between said microprobe and recording layer that ensures that the current is of constant intensity when passing from a first lighting state of said zone to a second lighting state of the same zone, and deducing information recorded in said zone from the variation in distance.

13. Process of claim 12, wherein said steps of measuring and deducing are divided into two phases:

in the first phase the zone to be read is subjected to a first lighting state and the distance separating microprobe from the recording layer is adjusted to a first value (d1) to obtain an intensity equivalent to a given value(Io), in a second phase the zone read is subjected to a second lighting state and the distance separating microprobe from recording layer is readjusted to a second value (d2) needed to ensure the same intensity (Io); the information recorded is deduced from the difference between the first value (d1) and the second, (d2).

14. Process of claim 12 or 13 in which the information recorded on the medium can be obtained by measuring said variations in distance in each zone, one by one.

15. Process of claim 12 or 13 in which the information recorded on the entire medium is obtained by subjecting the entire medium to a first lighting state, measuring the distance between microprobe and recording layer (15) for each zone of the medium to obtain a given intensity (Io); the entire medium is then subjected to a second lighting state and the distance between microprobe and the recording layer (15) required to obtain the same intensity (Io) is measured.

* * * * *